United States Patent
Morishita (10) Patent No.: US 10,332,719 B2
(45) Date of Patent: Jun. 25, 2019

(54) DEVICE AND METHOD FOR COMPUTING ANGULAR RANGE FOR MEASUREMENT OF ABERRATIONS AND ELECTRON MICROSCOPE

(71) Applicant: JEOL Ltd., Tokyo (JP)

(72) Inventor: Shigeyuki Morishita, Tokyo (JP)

(73) Assignee: JEOL Ltd., Tokyo (JP)

( * ) Notice: Subject to any disclaimer, the term of this patent is extended or adjusted under 35 U.S.C. 154(b) by 427 days.

(21) Appl. No.: 14/743,086

(22) Filed: Jun. 18, 2015

(65) Prior Publication Data

US 2016/0020066 A1  Jan. 21, 2016

(30) Foreign Application Priority Data

Jun. 18, 2014  (JP) ................................ 2014-125380

(51) Int. Cl.
*H01J 37/22* (2006.01)
*H01J 37/28* (2006.01)

(52) U.S. Cl.
CPC ............ *H01J 37/222* (2013.01); *H01J 37/28* (2013.01); *H01J 2237/1534* (2013.01); *H01J 2237/2802* (2013.01); *H01J 2237/2809* (2013.01)

(58) Field of Classification Search
CPC ............... H01J 37/28; H01J 2237/2802; H01J 2237/2809; H01J 2237/1534
See application file for complete search history.

(56) References Cited

U.S. PATENT DOCUMENTS

| 6,770,887 B2 * | 8/2004 | Krivanek | H01J 37/153 250/310 |
| 8,389,937 B2 * | 3/2013 | Own | H01J 37/153 250/306 |
| 2011/0272578 A1 * | 11/2011 | Hirose | H01J 37/153 250/310 |
| 2013/0256531 A1 * | 10/2013 | Yoshida | H01J 37/153 250/307 |

OTHER PUBLICATIONS

Glaeser et al., Review: Precise Beam-Tilt Alignment and Collimation Are Required to Minimize the Phase Error With Coma in High-Resolution Cryo-EM, Journal of Structural Biology, vol. 174, Issue 1, pp. 1-20.*
F. Zemlin et al., "Coma-Free Alignment of High Resolution Electron Microscopes with the Aid of Optical Diffractograms", Ultramicroscopy, 1978, pp. 49-60, 3.

* cited by examiner

*Primary Examiner* — Sujoy K Kundu
*Assistant Examiner* — L. Anderson
(74) *Attorney, Agent, or Firm* — The Webb Law Firm (57) ABSTRACT

A device which computes an angular range of illumination of an electron beam in which aberrations in an optical system can be measured efficiently by a tableau method. The device (100) includes an aberration coefficient information acquisition portion (112) for obtaining information about aberration coefficients of the optical system, a phase distribution computing portion (114) for finding a distribution of phases in the electron beam passed through the optical system on the basis of the information about the aberration coefficients, and an angular range computing portion (116) for finding the angular range of illumination on the basis of the distribution of phases found by the phase distribution computing portion (114).

12 Claims, 5 Drawing Sheets

DEVICE AND METHOD FOR COMPUTING ANGULAR RANGE FOR MEASUREMENT OF ABERRATIONS AND ELECTRON MICROSCOPE

BACKGROUND OF THE INVENTION

Field of the Invention

The present invention relates to a device and method for computing an angular range for measurement of aberrations. The invention also relates to an electron microscope.

Description of Related Art

The diffractogram tableau method is known as a method of measuring aberrations in the imaging system of a transmission electron microscope and aberrations in the illumination system of a scanning transmission electron microscope.

Where aberrations in the imaging system of a transmission electron microscope are measured by the tableau method, plural TEM images of an amorphous sample are taken while varying the angle of illumination of an electron beam on a sample surface, the TEM images are Fourier transformed to thereby obtain diffractograms, and the aberrations are measured based on the diffractograms. This is known as the diffractogram tableau method (see F. Zemlin et al., Ultramicroscopy 3, pp. 49-60 (1978)). The angle of illumination of the electron beam is measured with respect to the optical axis of the objective lens. This can also be termed a tilt angle of the electron beam relative to the optical axis of the objective lens. Since the accuracy at which aberrations are measured depends on the number of obtained diffractograms and on the angular range of illumination, it is necessary to preset these parameters.

Where aberrations in the illumination system of a transmission electron microscope are measured by the tableau method, plural STEM images are taken while varying the angle of illumination of an electron beam on a sample surface, the SEM images are deconvolved to produce probe images, and the aberrations are measured based on the probe images. This is known as the probe tableau method. Since the accuracy at which the aberrations are measured depends on the number of obtained probe images and on the angular range of illumination, it is necessary to preset these parameters.

When aberrations are measured by the above-described tableau method, as information is collected from a wider angular range of illumination, aberrations are measured at higher accuracy. However, if the electron beam is tilted to a high angle, defocus may be inverted or diffractograms may be spread crosswise, making the analysis difficult. Furthermore, if the number of obtained diffractograms or probe images is increased, it takes longer to capture the diffractograms or images. Therefore, it follows that aberrations are measured using only a limited number of diffractograms or probe images. Consequently, the angular range of illumination must be so set that aberrations can be measured efficiently with a few number of diffractograms.

When aberrations are measured by the tableau method in this way, it is important to appropriately set the angular range of illumination used for measurement such that aberrations can be measured efficiently. In the past, the user has set the angular range of illumination, drawing on his or her own experience.

SUMMARY OF THE INVENTION

In view of the foregoing problem, the present invention has been made. One object associated with some aspects of the present invention is to provide a device and method capable of finding an angular range of illumination in which aberrations can be measured efficiently by a tableau method. Another object associated with some aspects of the invention is to provide an electron microscope including this device of computing an angular range for measurement of aberrations.

(1) A device associated with the present invention to compute an angular range for measurement of aberrations is adapted to compute an angular range of illumination of an electron beam when aberrations in an optical system are measured by a tableau method. The device includes: an aberration coefficient information acquisition portion for obtaining information about aberration coefficients of the optical system; a phase distribution computing portion for finding a distribution of phases in the electron beam passed through the optical system on the basis of the information about the aberration coefficients; and an angular range computing portion for finding the angular range of illumination on the basis of the distribution of phases found by the phase distribution computing portion.

In this device for computing an angular range for measurement of aberrations, the angular range of illumination of the electron beam is found on the basis of a distribution of phases in the beam and so it is possible to find an angular range of illumination in which aberrations can be measured efficiently by the tableau method.

(2) In one feature of this device for computing an angular range for measurement of aberrations, the phase distribution computing portion may find the distribution, X, of phases using the following equation:

$$X(\omega) = \frac{2\pi}{\lambda} \text{Re}\left[\frac{1}{3}P_3\bar{\omega}^2\omega + \frac{1}{3}A_3\bar{\omega}^3 + \frac{1}{4}O_4\bar{\omega}^2\omega^2 + \frac{1}{4}Q_4\bar{\omega}^3\omega + \frac{1}{4}A_4\bar{\omega}^4 + \ldots\right]$$

where $\omega$ is a complex angle, $\bar{\omega}$ is the complex conjugate of $\omega$, $\lambda$ is the wavelength of the electron beam, and $P_3$, $A_3$, $O_4$, $Q_4$, and $A_4$ are aberration coefficients. Note that $P_3$ is comatic aberration, $A_3$ is three-fold astigmatism, $O_4$ is third-order spherical aberration, $Q_4$ is star aberration, and $A_4$ is four-fold astigmatism. Re indicates that the real part of the formula within the square brackets is taken.

(3) In one feature of the angular range computing device as set forth in the paragraph (2) above, the angular range computing portion may set the upper limit of the angular range of illumination to be equal to or greater than an angle of illumination at which phases in the distribution of phases found by the phase distribution computing portion have absolute values of $\pi/4$ or $\pi/2$.

With this device for computing an angular range for measurement of aberrations, an angular range of illumination in which aberrations can be measured efficiently by a tableau method can be found.

(4) In a further feature of the angular range computing device as set forth in the paragraph (2) above, the optical system may be an imaging system.

In this device for computing an angular range for measurement of aberrations, when aberrations induced in the imaging system are measured by a tableau method, an angular range of illumination in which aberrations can be measured efficiently can be found.

(5) In another feature of the angular range computing device as set forth in the paragraph (1) above, the optical system may be an illumination system.

In this device for computing an angular range for measurement of aberrations, when aberrations induced in the illumination system are measured by a tableau method, an angular range of illumination in which aberrations can be measured efficiently can be found.

(6) A method associated with the present invention to compute an angular range for measurement of aberrations is adapted to compute an angular range of illumination of an electron beam when aberrations in an optical system are measured by a tableau method. This method starts with obtaining information about aberration coefficients of the optical system. Then, a distribution of phases in the electron beam passed through the optical system is found on the basis of the information about the aberration coefficients. The angular range of illumination is found on the basis of the found distribution of phases.

In this method for computing an angular range for measurement of aberrations, the angular range of illumination of the electron beam is found, based on a distribution of phases in the electron beam and, therefore, an angular range of illumination in which aberrations can be measured efficiently by a tableau method can be found.

(7) In one feature of this method for computing an angular range for measurement of aberrations, during the step of finding a distribution of phases in the electron beam, the distribution, X, of phases may be found using the following equation:

$$X(\omega) = \frac{2\pi}{\lambda} \text{Re}\left[\frac{1}{3}P_3\bar{\omega}^2\omega + \frac{1}{3}A_3\bar{\omega}^3 + \frac{1}{4}O_4\bar{\omega}^2\omega^2 + \frac{1}{4}Q_4\bar{\omega}^3\omega + \frac{1}{4}A_4\bar{\omega}^4 + \ldots\right]$$

where $\omega$ is a complex angle, $\bar{\omega}$ is the complex conjugate of $\omega$, $\lambda$ is the wavelength of the electron beam, and $P_3$, $A_3$, $O_4$, $Q_4$, and $A_4$ are aberration coefficients. Note that $P_3$ is comatic aberration, $A_3$ is three-fold astigmatism, $O_4$ is third-order spherical aberration, $Q_4$ is star aberration, and $A_4$ is four-fold astigmatism. Re indicates that the real part of the formula within the square brackets is taken.

(8) In a further feature of this method for computing an angular range for measurement of aberrations, during the step of finding the angular range, the upper limit of the angular range of illumination may be set to be equal to or greater than an angle of illumination at which phases in the distribution of phases found by the step of finding a distribution of phases have absolute values of $\pi/4$ or $\pi/2$.

In this method for computing an angular range for measurement of aberrations, an angular range of illumination in which aberrations can be measured efficiently by a tableau method can be found.

(9) In an additional feature of this method for computing an angular range for measurement of aberrations, the optical system may be an imaging system.

This method for computing an angular range for measurement of aberrations makes it possible to find an angular range of illumination in which aberrations can be measured efficiently when aberrations induced in an imaging system are measured by a tableau method.

(10) In a still other feature of this method for computing an angular range for measurement of aberrations, the optical system may be an illumination system.

This method for computing an angular range for measurement of aberrations makes it possible to find an angular range of illumination in which aberrations can be measured efficiently when aberrations induced in an illumination system are measured by a tableau method.

(11) An electron microscope associated with the present invention includes a device which is associated with the present invention to compute an angular range for measurement of aberrations.

This electron microscope includes a device associated with the present invention to compute an angular range for measurement of aberrations and so the time taken to capture TEM images for acquisition of diffractograms and the time taken to capture STEM images for acquisition of probe images can be shortened. Consequently, aberrations can be measured efficiently.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Device for Computing Angular Range for Measurement of Aberrations and Electron Microscope An electron microscope equipped with a device associated with a first embodiment of the present invention to compute an angular range for measurement of aberrations is first described by referring to FIG. 1, which schematically shows the configuration of the electron microscope, 1000, including the angular range computing device, 100, associated with the first embodiment. The electron microscope 1000 includes an electron microscope body 10 in addition to the angular range computing device 100.

Figure 1:
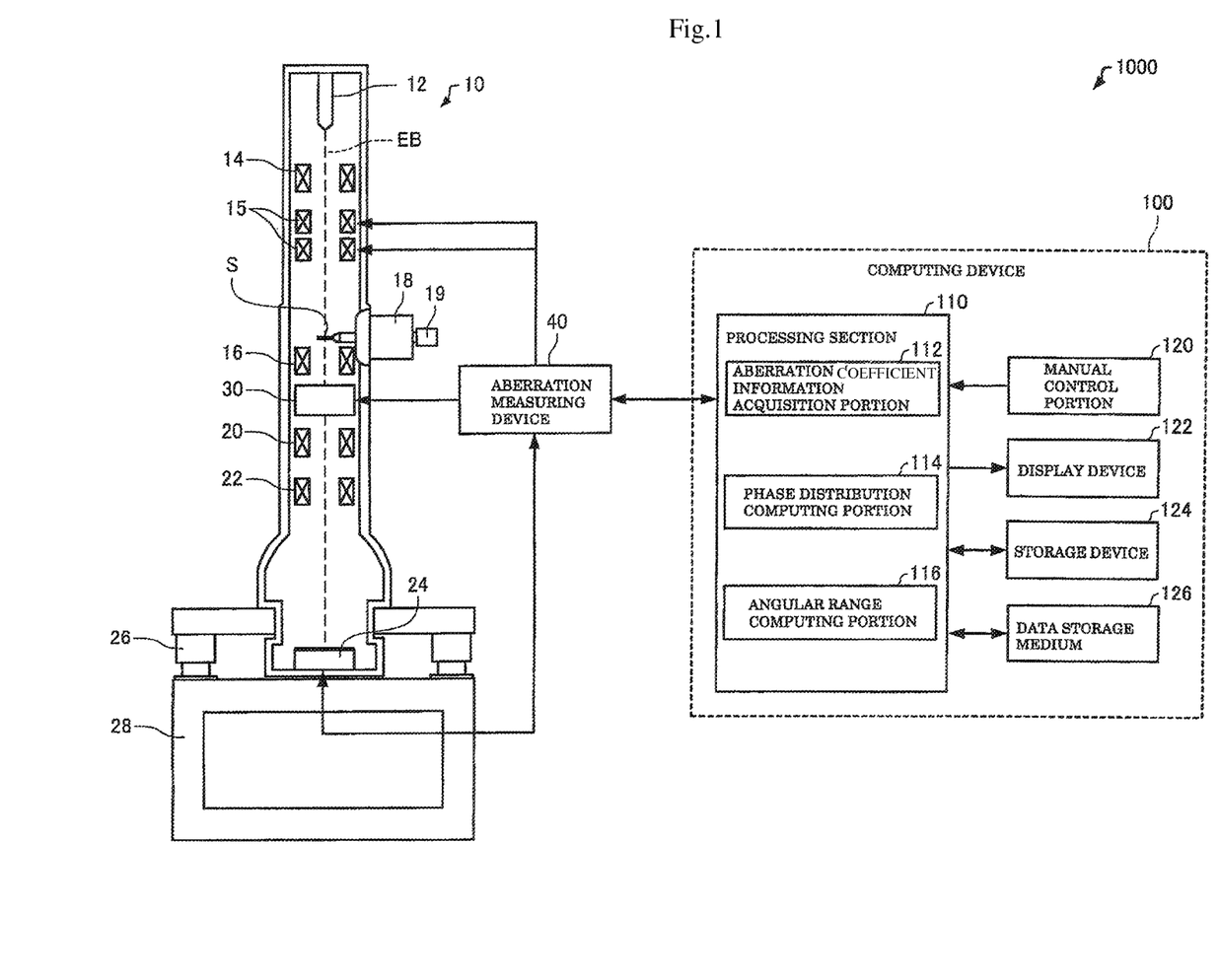
FIG. 1 is a schematic vertical cross section, partly in block form, of an electron microscope including a device associated with a first embodiment of the present invention to compute an angular range for measurement of aberrations.

For example, the electron microscope 1000 is a transmission electron microscope (TEM) that is an instrument for imaging electrons transmitted through a sample S to obtain transmission electron microscope (TEM) images including bright field images, dark field images, diffraction patterns, and so on.

(1) Electron Microscope Body

The electron microscope body 10 is first described. The microscope body 10 includes an electron beam source 12, a condenser lens system 14, an electron beam deflector 15, an objective lens 16, a sample stage 18, an intermediate lens 20, a projector lens 22, an imager 24, an aberration corrector 30, and an aberration measuring device 40.

The electron beam source 12 produces an electron beam EB by accelerating electrons by means of an anode after the electrons are emitted from a cathode. An electron gun can be used as the electron beam source 12. No restrictions are imposed on the electron gun used as the electron beam source 12. For example, a thermionic electron gun, a thermal field-emission electron gun, a cold field emission gun, or other electron gun can be used.

The condenser lens system 14 is located behind (on the downstream side relative to the direction of the electron beam EB) the electron beam source 12 and used to focus the electron beam EB produced by the electron beam source 12 onto the sample S. The condenser lens system 14 may be configured including plural lenses (not shown).

The electron beam deflector 15 is disposed behind the condenser lens system 14 and can deflect the electron beam EB coming from the condenser lens system 14. Consequently, the angle of the electron beam EB hitting the sample S relative to the surface of the sample S (i.e., relative to the optical axis of the objective lens 16) can be controlled.

The electron beam deflector 15 is configured, for example, including deflection coils operative to produce magnetic fields for deflecting the electron beam EB. The deflector 15 for deflecting the electron beam EB has two stages of deflection systems, for example, consisting of upper and lower pairs of deflection coils.

The objective lens 16 is disposed behind the electron beam deflector 15. The objective lens 16 is an initial stage of lens for imaging the electron beam EB transmitted through the sample S and has an upper polepiece and a lower polepiece (not shown). The objective lens 16 produces a magnetic field between the upper and lower polepieces to focus the beam EB.

The sample stage 18 holds the sample S. In the illustrated example, the sample stage 18 holds the sample S via a sample holder 19. For example, the sample stage 18 places the sample S between the upper and lower polepieces of the objective lens 16. The sample stage 18 can place the sample S in position by moving and stopping the sample holder 19. The sample stage 18 can move the sample S in a horizontal direction perpendicular to the direction of travel of the electron beam EB and also in a vertical direction along the direction of travel of the beam EB. Furthermore, the sample stage 18 can tilt the sample S.

In the illustrated example, the sample stage 18 is a side-entry stage for inserting the sample S from a side of the polepieces (not shown) of the objective lens 16. Alternatively, the sample stage 18 may be a top-loading stage for inserting the sample S from above the polepieces.

The intermediate lens 20 is located behind the objective lens 16. The projector lens 22 is disposed behind the intermediate lens 20. The intermediate lens 20 and projector lens 22 further magnify the image focused by the objective lens 16 and focus the image onto the imager 24. In the electron microscope 1000, the objective lens 16, intermediate lens 20, and projector lens 22 together constitute an imaging system.

The imager 24 captures the TEM image focused by the imaging system. For example, the imager 24 is a digital camera such as a CCD camera. The imager 24 outputs information about the captured TEM image to the aberration measuring device 40.

The aberration corrector 30 is disposed behind the objective lens 16. In the illustrated example, the corrector 30 is disposed between the objective lens 16 and the intermediate lens 20. The aberration corrector 30 is an instrument for correcting aberrations in the imaging system. The corrector 30 is configured, for example, including multipole elements (such as hexapole elements and octopole elements) producing magnetic fields. The corrector 30 can correct higher-order aberrations such as spherical aberration and star aberration in the imaging system by producing a given magnetic field using multipole elements. For example, the corrector 30 corrects spherical aberration in the imaging system by producing negative spherical aberration so as to cancel out positive spherical aberration in the imaging system. The aberration corrector 30 corrects aberrations based on information about aberrations measured by the aberration measuring device 40.

The aberration measuring device 40 measures aberrations in the imaging system by the diffractogram tableau method which is a technique for measuring aberrations by taking plural TEM images of an amorphous sample while varying the angle of illumination of the electron beam on the sample surface, Fourier transforming the TEM images to produce diffractograms, and measuring the aberrations based on the diffractograms.

In the diffractogram tableau method, higher-order aberrations such as spherical aberration and star aberration can be measured by obtaining diffractograms of TEM images of an amorphous sample while varying the angle of illumination of the electron beam and making use of apparent defocus and apparent two-fold astigmatism found.

Figure 2:
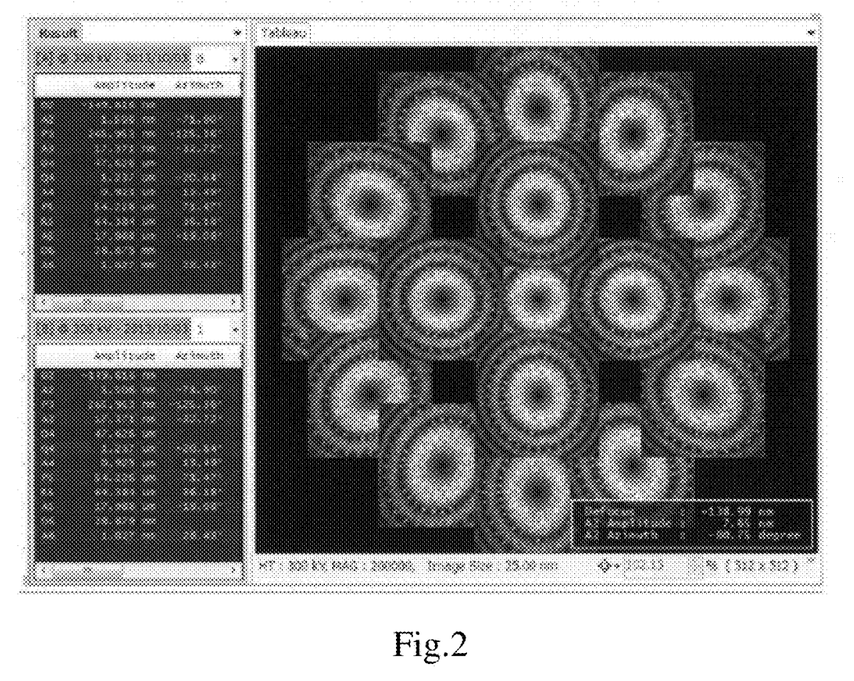
FIG. 2 shows one example of diffractogram tableau.

FIG. 2 shows one example of diffractogram tableau. In this diffractogram tableau, the position of each diffractogram reflects the angle and orientation of illumination of the electron beam EB.

In particular, the aberration measuring device 40 first sets an angular range of illumination of the electron beam EB when aberrations are measured by the diffractogram tableau method. For this purpose, the aberration measuring device 40 obtains information about the angular range of illumination found by the device 100 for computing an angular range for measurement of aberrations. In the aberration measuring device 40, the number of diffractograms used when aberrations are measured by a diffractogram tableau method is preset at will.

The aberration measuring device 40 obtains information about TEM images in accordance with the set angular range of illumination and number of diffractograms. The aberration measuring device 40 acquires TEM images whose number corresponds to the set number of diffractograms by controlling the electron beam deflector 15 to obtain TEM images in the set angular range of illumination and taking TEM images by the imager 24 while varying the angle of illumination of the electron beam EB.

The aberration measuring device 40 Fourier transforms TEM images taken while varying the angle of illumination of the electron beam EB to create diffractograms and arranges the created diffractograms according to the angle and orientation of illumination, thus creating a diffractogram tableau. This diffractogram tableau provides information about aberrations (such as information about higher-order aberrations and information about aberration coefficients $P_3$, $A_3$, $O_4$, $Q_4$, $A_4$, and so on).

The aberration measuring device 40 outputs the information about aberrations to the aberration corrector 30, the information being obtained by the diffractogram tableau method. The aberration corrector 30 receives the information about aberrations and produces a given magnetic field to correct aberrations in the imaging system. Furthermore, the aberration measuring device 40 outputs this information about aberrations (aberration coefficients) to the device 100 for computing an angular range for measurement of aberrations. The angular range computing device 100 computes an angular range of the illumination of the electron beam EB, based on the information about the aberration coefficients.

The aberration measuring device 40 operates, for example, to make a decision as to whether aberration correction is necessary from the information about the found aberrations. For example, if the found aberrations are greater than a given value, the aberration measuring device 40 determines that it is necessary to make an aberration correction. If the found aberrations are less than the given value, the aberration measuring device 40 determines that it is not necessary to make an aberration correction. If it is determined that an aberration correction is needed, the aberration measuring device 40 outputs information about the aberrations to the aberration corrector 30 and to the angular range computing device 100. If it is determined that any aberration correction is not needed, the aberration measuring device 40 ends the present processing subroutine without outputting the information about the aberrations either to the aberration corrector 30 or to the angular range computing device 100.

The aberration measuring device 40 acts as a computer by executing programs stored in a storage portion (not shown), for example, by means of a CPU (central processing unit) and performs the above-described processing and various control operations. The aberration measuring device 40 is made of a general-purpose computer such as a personal computer (PC). In the illustrated example, the electron microscope body 10 is mounted on a pedestal 28 via vibration isolators 26.

(2) Device for Computing Angular Range for Measurement of Aberrations

The device 100 for computing an angular range for measurement of aberrations is next described. The computing device 100 finds an angular range of the illumination of the electron beam EB when aberrations induced in the imaging system are measured by a diffractogram tableau method. The device 100 for computing an angular range for measurement of aberrations is made of a general-purpose computer such as a personal computer (PC) and includes a processing section 110, a manual control portion 120, a display device 122, a storage device 124, and a data storage medium 126.

The manual control portion 120 obtains a manual control signal responsive to a user's manipulation or action and sends the signal to the processing section 110. The manual control portion 120 is made, for example, of buttons, keys, a touch panel display, or a microphone.

The display device 122 provides a display of the image generated by the processing section 110. The function of the display device 122 can be implemented by an LCD, CRT, or the like. The display device 122 provides a display of information about the angular range of the illumination of the electron beam EB when aberrations are measured by a diffractogram tableau method, the range being found by the processing section 110.

The storage device 124 acts as a working area for the processing section 110. The function of the storage device 124 can be implemented by a RAM or the like. The storage device 124 stores programs, data, and other related information permitting the processing section 110 to perform various kinds of computational processing and control operations. The processing section 110 is also used to temporarily store the results of computations executed in accordance with various programs.

The data storage medium 126 is a computer-readable medium and stores programs, data, and related information. The function of the storage medium 126 can be implemented by an optical disc (such as a CD or DVD), a magnetooptical disc (MO), magnetic disc, hard disc, magnetic tape, or memory (such as a ROM). The processing section 110 performs various kinds of processing of the present embodiment based on programs and data stored in the data storage medium 126. The storage medium 126 can store computer programs for causing a computer to act as various portions of the processing section 110.

The processing section 110 performs various computational operations in accordance with computer programs stored in the storage device 124. The processing section 110 operates as an aberration coefficient information acquisition portion 112, a phase distribution computing portion 114, and an angular range computing portion 116 as described below by executing programs stored in the storage device 124. The functions of the processing section 110 can be implemented by hardware such as various processors (e.g., a CPU or DSP), an ASIC (such as a gate array), or computer programs. At least a part of the processing section 110 may be implemented by hardware such as dedicated circuitry.

The aberration coefficient information acquisition portion 112 obtains information about aberration coefficients of the imaging system. The aberration coefficients of the imaging system are found by the aberration measuring device 40 using a diffractogram tableau method. The aberration coefficient information acquisition portion 112 obtains the information about the aberration coefficients of the imaging system, the information being derived by the aberration measuring device 40.

The phase distribution computing portion 114 finds a distribution of phases in the electron beam EB transmitted through the imaging system using the following Eq. (1), based on the information about the aberration coefficients obtained by the aberration coefficient information acquisition portion 112.

$$X(\omega) = \frac{2\pi}{\lambda} \mathrm{Re}\left[ \frac{1}{3} P_3 \bar{\omega}^2 \omega + \frac{1}{3} A_3 \bar{\omega}^3 + \frac{1}{4} O_4 \bar{\omega}^2 \omega^2 + \frac{1}{4} Q_4 \bar{\omega}^3 \omega + \frac{1}{4} A_4 \bar{\omega}^4 + \ldots \right] \quad (1)$$

where X is the distribution of phases, $\omega$ is a complex angle, $\bar{\omega}$ is the complex conjugate of $\omega$, $\lambda$ is the wavelength of the electron beam, and $P_3$, $A_3$, $O_4$, $Q_4$, and $A_4$ are aberration coefficients. Note that $P_3$ is comatic aberration, $A_3$ is three-fold astigmatism, $O_4$ is third-order spherical aberration, $Q_4$ is star aberration, and $A_4$ is four-fold astigmatism. Re indicates that the real part of the formula within the square brackets is taken.

In Eq. (1), $\omega$ corresponds to the angle of illumination of the electron beam. Let (x, y) be a coordinate in an angular space representing a phase distribution. It follows that $\omega = x + iy$. The information about the aberration coefficients derived by the aberration coefficient information acquisition portion 112 is used for the values of the aberration coefficients $P_3$, $A_3$, $O_4$, $Q_4$, $A_4$, and so on of Eq. (1). In Eq. (1) above, if the aberrations up to the nth order are taken into account, computations up to the nth-order aberration coefficient are performed.

Figure 3:
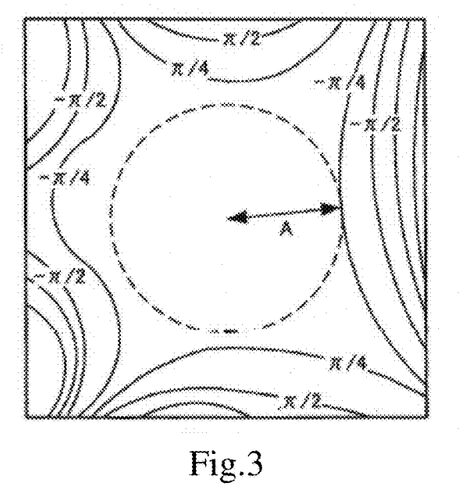
FIG. 3 is a schematic representation of one example of phase distribution.

The phase distribution X is represented as deviations of phases caused by aberrations in the electron beam EB transmitted through the imaging system, i.e., deviations of an ideal image free of aberrations from a wavefront, i.e., wavefront aberrations. FIG. 3 schematically shows one example of the phase distribution X found using Eq. (1). In FIG. 3, amounts of deviation of phases of an electron wavefront are indicated by contour lines. It can be seen from FIG. 3 that a region of uniform phase spreads from the center of a phase distribution diagram and that the absolute value of each phase increases in going toward each end (i.e., with increasing the angle of illumination of the electron beam EB).

The angular range computing portion 116 finds an angular range of the illumination of the electron beam EB, based on the phase distribution computed by the phase distribution computing portion 114. For example, the angular range computing portion 116 finds the angular range of illumination on the basis of a minimum angle $|\omega|$ at which the absolute values of phases are $\pi/4$ in the phase distribution computed by the phase distribution computing portion 114. In a region of the optical system where the absolute values of phases are $\pi/4$, the effects of deviations of phases due to aberration can be neglected. The minimum angle $|\omega|$ at which the absolute angles of phases are $\pi/4$ is hereinafter also referred to as the minimum angle $\theta$. The minimum angle $|\omega|$ corresponds to the shortest distance between each region where the absolute angles of phases are $\pi/4$ and the center of the phase distribution diagram in the phase distribution X. For example, in the example shown in FIG. 3, the phase distribution X varies depending on the direction (orientation) relative to the center. The magnitude of a vector A connecting together a region where the absolute values of phases vary by $\pi/4$ and the center with the shortest distance corresponds to the minimum angle $\theta$.

For example, the angular range computing portion 116 sets the upper limit of the angular range of the illumination to ranges where the absolute values of phases are equal to or greater than the minimum angle $\theta$ in the phase distribution found by the phase distribution computing portion 114. Furthermore, the angular range computing portion 116 sets the upper limit of the angular range of the illumination to an angle smaller than the minimum angle $|\omega|$ of phase at which defocus is inverted or diffractograms are spread crosswise in the phase distribution X.

In particular, where the accelerating voltage of the electron beam EB is 300 keV, for example, the upper limit of the angular range of illumination is set to between the minimum angle $\theta \times 1.5$ and the minimum angle $\theta \times 3$, inclusively. Where the accelerating voltage of the electron beam EB is 80 keV, for example, the upper limit of the angular range of illumination is set to between the minimum angle $\theta \times 1$ and the minimum angle $\theta \times 2$, inclusively. It is possible to prevent inversion of defocus and crosswise stretch of diffractograms by finding the upper limit of the angular range of the illumination on the basis of the minimum angle $\theta$ determined based on the phase distribution in this way. The angular range computing portion 116 finds the upper limit of the angular range of the illumination in this way, and sets the lower limit of the range to zero. As a result, the angular range of the illumination is determined.

In the example provided so far, the minimum angle $|\omega|$ at which the absolute angles of phases are $\pi/4$ is used as a basis for finding an angular range of the illumination from the phase distribution diagram of FIG. 3. Alternatively, the minimum angle $|\omega|$ at which the absolute values of phases are $\pi/2$ may be used as a basis. That is, the regions where the absolute values of phases are $\pi/2$ may be taken as regions where the effects of deviations of phases due to aberrations in the optical system can be neglected.

The processing section 110 outputs information about the angular range of the illumination computed by the angular range computing portion 116 to the aberration measuring device 40. In response to the information about the angular range of the illumination computed by the angular range computing portion 116, the aberration measuring device 40 sets the angular range of illumination of the electron beam when aberrations are measured by a diffractogram tableau method. Furthermore, the processing section 110 may operate such that the information about the angular range of the illumination found by the angular range computing portion 116 is displayed on the display device 122.

The device 100 for computing an angular range for measurement of aberrations has the following features. In this angular range computing device 100, the phase distribution computing portion 114 finds a distribution of phases in the electron beam passed through the imaging system on the basis of information about aberration coefficients of the imaging system obtained by the aberration coefficient information acquisition portion 112. The angular range computing portion 116 finds an angular range of illumination on the basis of the information about the phase distribution. Consequently, the angular range computing device 100 can find an angular range of illumination in which aberrations can be measured efficiently by a diffractogram tableau method without incurring inversion of defocus or crosswise stretch of diffractograms.

For example, when a diffractogram tableau method is implemented, if the electron beam is tilted up to a high angle, there arises the problem that the analysis is made difficult because defocus is inverted or diffractograms are spread crosswise. On the other hand, in the device 100 for computing an angular range for measurement of aberrations, an angular range of illumination is found based on a phase distribution in the electron beam EB passed through the imaging system. Consequently, it is possible to prevent the angular range of illumination from being set to a high angle; otherwise, defocus would be inverted or diffractograms would be spread crosswise.

In the device 100 for computing an angular range for measurement of aberrations, the angular range computing portion 116 sets the upper limit of the angular range of the illumination to be equal to or greater than an angle of illumination at which the absolute values of phases in the phase distribution found by the phase distribution computing portion 114 are $\pi/4$ or $\pi/2$. Consequently, an angular range of the illumination in which aberrations can be measured efficiently by a diffractogram tableau method can be found.

For example, if the upper limit of the angular range of the illumination is set to be less than an angle at which the absolute values of phases in the distribution of phases are $\pi/4$, then it follows that regions where the effects of deviations of phases due to aberrations in the optical system can be neglected, i.e., aberration correction is not needed, are measured again, deteriorating the efficiency. The device 100 for computing an angular range for measurement of aberrations does not suffer from this problem, because the upper limit of the angular range of the illumination is set to be equal to or greater than an angle of illumination at which the absolute values of phases are $\pi/4$ or $\pi/2$. Consequently, an angular range of the illumination in which aberrations can be measured efficiently without causing such a problem can be found.

When aberrations incurred in the imaging system are measured by a diffractogram tableau method, the angular range computing device 100 can find an angular range of illumination in which aberrations can be measured efficiently.

Since the electron microscope 1000 includes the device 100 for computing an angular range for measurement of aberrations, when aberrations produced in the imaging system are measured by a diffractogram tableau method, TEM images for obtaining diffractograms can be captured in a shorter time and the aberrations in the imaging system can be measured efficiently.

1.2. Method of Aberration Correction

Figure 4:
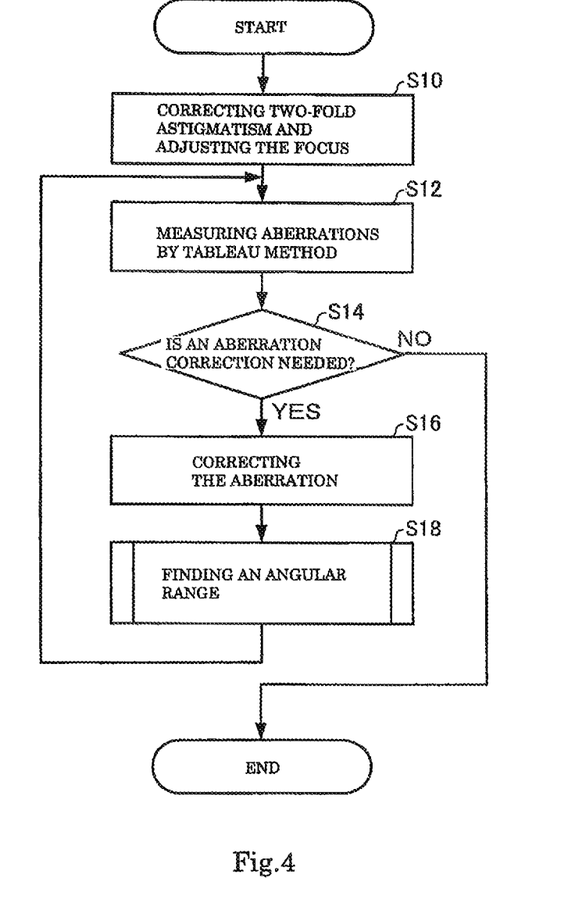
FIG. 4 is a flowchart illustrating one example of aberration correction method associated with the first embodiment and implemented in an electron microscope.

An aberration correction method implemented in an electron microscope equipped with the angular range computing device associated with the first embodiment is next described by referring to FIG. 4, which is a flowchart illustrating one example of the aberration correction method implemented in the electron microscope 1000 having the device for computing an angular range for measurement of aberrations, the device being associated with the first embodiment.

The microscope body 10 of the electron microscope 1000 first corrects two-fold astigmatism and adjusts the focus (step S10).

The correction of two-fold astigmatism may be done either manually by a user who manipulates a stigmator (not shown) or automatically by the stigmator which obtains TEM images from the imager 24, computes astigmatism, and makes an astigmatic correction. The focus may be adjusted either manually by a user who manipulates a manual controller (not shown) mounted on the microscope body 10 for focus adjustment or automatically by an automated defocus adjustment consisting of obtaining TEM images from the imager 24, computing defocus, and varying the focus of the objective lens 16 or the height of the sample.

Then, the aberration measuring device 40 measures aberrations in the imaging system by a diffractogram tableau method (step S12).

After the adjustment of the two-fold astigmatism and the focus has been made, if the user asks for start of measurement of aberrations via the manual control portion 120, the aberration measuring device 40 receives a manual control signal from the manual control portion 120 and starts an operation for measuring aberrations. This operation of the aberration measuring device 40 is described in detail below.

If the operation for measuring aberrations starts, the aberration measuring device 40 obtains information about an angular range of illumination of the electron beam used to measure aberrations from the device 100 for computing an angular range for measurement of aberrations and sets an angular range of illumination of the electron beam EB used when aberrations are measured using a diffractogram tableau method. At this time, the angular range computing device 100 outputs information about initial values in the angular range of the illumination which have been previously set at will to the aberration measuring device 40. In this way, in the first measurement of aberrations using a diffractogram tableau method, the angular range computing device 100 outputs information about the preset initial values in the angular range of the illumination.

As described later, in the second measurement of aberrations, the angular range computing device 100 finds an angular range of the illumination for measurement of aberrations based on information about aberration coefficients obtained by the first measurement of aberrations. The aberration measuring device 40 obtains information about the angular range of the illumination and sets an angular range of the illumination of the electron beam EB. The third and following measurements are performed similarly. In particular, in the nth measurement (where n is a natural number) of aberrations, the angular range computing device 100 finds an angular range of illumination based on the information about aberration coefficients obtained by the (n−1)th measurement of aberrations. The aberration measuring device 40 obtains information about the angular range of illumination and sets an angular range of the illumination of the electron beam EB.

Then, the aberration measuring device 40 controls the electron beam deflector 15 according to the set angular range of the illumination and the number of diffractograms. The imager 24 captures images while varying the angle of the illumination of the electron beam EB. TEM images corresponding in number to the set number of diffractograms are taken.

The aberration measuring device 40 then Fourier transforms the TEM images obtained with different angles of illumination of the electron beam EB, creates diffractograms, and arranges the created diffractograms according to the angles and orientations of the illumination, thus creating a diffractogram tableau. The aberration measuring device 40 finds information about aberrations or aberration coefficients from the created diffractogram tableau. Because of the operations described so far, the aberration measuring device 40 can measure aberrations.

The aberration measuring device 40 then operates to make a decision as to whether an aberration correction is needed, based on the found information about aberrations (step S14).

If the found aberration is greater than a given value, the aberration measuring device 40 determines that an aberration correction is needed. If not so, the aberration measuring device 40 determines that no aberration correction is necessary.

If the decision at step S14 is affirmative (YES), indicating that an aberration correction is needed, then the aberration measuring device 40 outputs information about the found aberration (aberration coefficients) to the aberration corrector 30 and to the angular range computing device 100. The aberration corrector 30 receives the information about the aberration delivered from the aberration measuring device 40 and produces a magnetic field for canceling out the aberration, thus correcting the aberration in the imaging system (step S16).

Then, the device 100 for computing an angular range for measurement of aberrations receives the output from the aberration measuring device 40 indicating the aberrations (aberration coefficients $P_3$, $A_3$, $O_4$, $Q_4$, and $A_4$) and finds an angular range of the illumination of the electron beam EB when aberrations produced in the imaging system are measured by a diffractogram tableau method (step S18). The computing device 100 outputs information about the found angular range of the illumination to the aberration measuring device 40. Details of the present processing step will be described later.

In the example described so far, the angular range computing device 100 finds an angular range of the illumination for measurement of aberrations (step S18) after the aberration corrector 30 performs an aberration correction (step S16). Alternatively, the aberration corrector 30 may perform an aberration correction after the angular range computing device 100 finds an angular range of the illumination for measurement of aberrations. Furthermore, the operation of the aberration corrector 30 for making an aberration correction and the operation of the angular range computing device 100 for finding an angular range of the illumination for measurement of aberrations may be performed at the same time.

Then, the aberration measuring device 40 measures aberrations in the imaging system by a diffractogram tableau method (step S12). At this time, the aberration measuring device 40 obtains information about an angular range of the illumination found by the angular range computing device 100 (i.e., the information about an angular range of the illumination found at step S18), sets an angular range of the illumination, and performs a second measurement of aberrations.

In this way, as long as the aberration measuring device 40 determines that an aberration correction is needed (i.e., the decision at step S14 is YES), the electron microscope 1000 repeats the processing sequence of steps S16, S18, S12, and S14. As a result, aberrations in the imaging system are corrected.

If the aberration measuring device 40 has determined that an aberration correction is not needed (i.e., the decision at step S14 is negative (NO)), that is, when the aberration found by the aberration measuring device 40 is less than a given value, the electron microscope 1000 ends the present subroutine for aberration correction.

Figure 5:
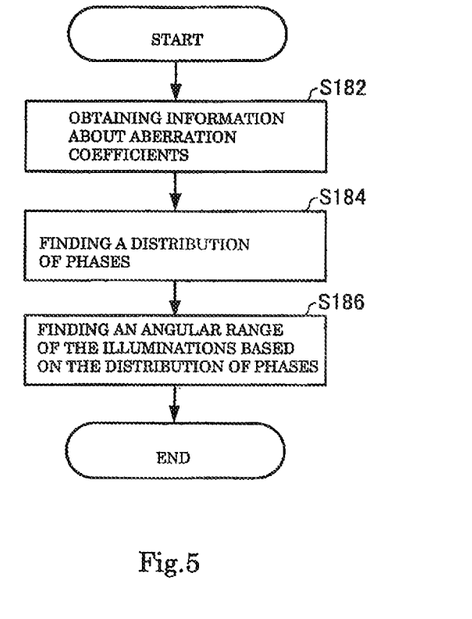
FIG. 5 is a flowchart illustrating one example of method for computing an angular range for measurement of aberrations, the method being implemented in the angular range computing device shown in FIG. 1.

The step S18 performed by the angular range computing device 100 to compute an angular range for measurement of aberrations is next described by referring to FIG. 5, which is a flowchart illustrating one example of the method for computing an aberration range for measurement of aberrations, the method being implemented by the range computing device 100.

First, the aberration coefficient information acquisition portion 112 obtains information about the aberration coefficients $P_3$, $A_3$, $O_4$, $Q_4$, and $A_4$ found by the aberration measuring device 40 (step S182).

Then, the phase distribution computing portion 114 finds a distribution of phases (see FIG. 3) of the electron beam EB passed through the imaging system, based on the information about aberration coefficients obtained by the aberration coefficient information acquisition portion 112 (step S184). The phase distribution computing portion 114 finds a phase distribution X using Eq. (1) above.

The angular range computing portion 116 finds an angular range of the illumination of the electron beam EB, based on the information about the phase distribution computed by the phase distribution computing portion 114 (step S186).

The angular range computing portion 116 sets the upper limit of the angular range of the illumination to be equal to or greater than a minimum angle $|\omega|$ (minimum angle $\theta$) at which the absolute values of phases in the phase distribution X found by the phase distribution computing portion 114 are $\pi/4$. Where the accelerating voltage of the electron beam EB is 300 kV, for example, the angular range computing portion 116 sets the upper limit of the angular range of the illumination to between the minimum angle $\theta \times 1.5$ and the minimum angle $\theta \times 3$, inclusively. Where the accelerating voltage of the electron beam EB is 80 kV, for example, the angular range computing portion 116 sets the upper limit of the angular range of the illumination to between the minimum angle $\theta \times 1$ and the minimum angle $\theta \times 2$, inclusively. The angular range computing portion 116 finds an upper limit of the angular range of the illumination in this way, sets the minimum value of the angular range to zero, and determines the angular range of the illumination.

The device 100 for computing an angular range for measurement of aberrations outputs information about the found angular range of the illumination to the aberration measuring device 40. Because of the processing described so far, it is possible to find an angular range of the illumination of the electron beam EB when aberrations in the imaging system are measured by a diffractogram tableau method.

The method associated with the present embodiment to compute an angular range for measurement of aberrations has the following features. This computing method comprises the steps of: obtaining information about aberration coefficients of an imaging system (step S182); finding a distribution of phases in the electron beam passed through the imaging system based on the obtained information about the aberration coefficients (step S184); and finding an angular range of the illumination based on the found distribution of phases (step S186). Therefore, the method associated with the present embodiment to compute an angular range for measurement of aberrations makes it possible to find an angular range of the illumination in which aberrations can be measured efficiently by a diffractogram tableau method without incurring inversion of defocus or crosswise stretch of diffractograms.

In the method associated with the present embodiment to compute an angular range for measurement of aberrations, during the step of finding an angular range, the upper limit of the angular range of the illumination is set equal to or greater than an angle of illumination at which the absolute values of phases in the phase distribution found by the phase distribution computing portion 114 are $\pi/4$ or $\pi/2$. Consequently, an angular range of the illumination in which aberrations can be measured efficiently by a diffractogram tableau method can be found.

In the method associated with the present embodiment to compute an angular range for measurement of aberrations, when aberrations induced in an imaging system are measured by a diffractogram tableau method, an angular range of the illumination in which aberrations can be measured efficiently can be found.

2. Second Embodiment

2.1. Device for Computing Angular Range for Measurement of Aberrations and Electron Microscope An electron microscope associated with a second embodiment of the present invention and equipped with a device for computing an angular range for measurement of aberrations is next described by referring to FIG. 6, which schematically shows the configuration of the electron microscope, 2000. Those components of the electron microscope 2000 which are similar in function to their respective counterparts of the electron microscope 1000 already described in connection with FIG. 1 are indicated by the same reference numerals as in FIG. 1 and a detailed description thereof is omitted.

In the above-described electron microscope 1000, as shown in FIG. 1, the aberration measuring device 40 measures aberrations in the imaging system, and the aberration corrector 30 corrects the aberrations in the imaging system based on information about the aberrations measured by the aberration measuring device 40.

Figure 6:
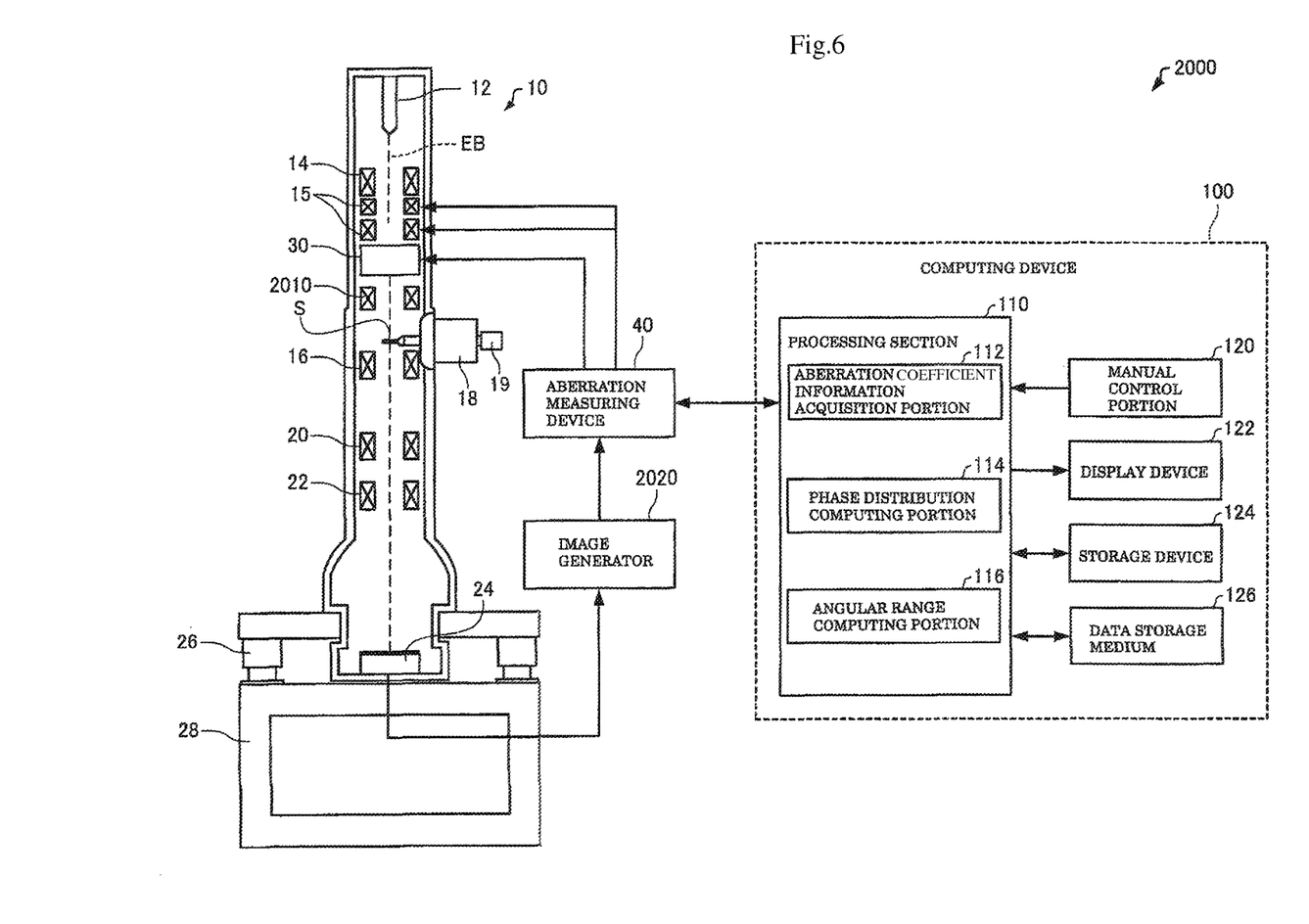
FIG. 6 is a schematic vertical cross section, partly in block form, of an electron microscope associated with a second embodiment.

On the other hand, in the electron microscope 2000, as shown in FIG. 6, the aberration measuring device 40 measures aberrations in the illumination system, and the aberration corrector 30 corrects aberrations in the illumination system based on information about the aberrations measured by the aberration measuring device 40.

In the example shown in FIG. 6, the electron microscope 2000 is a scanning transmission electron microscope (STEM), which is an instrument for scanning an electron probe over a sample S, detects electrons transmitted through the sample S, and obtains a scanning transmission electron microscope (STEM) image.

The aberration corrector 30 is located behind the condenser lens system 14. The aberration corrector 30 is an instrument for correcting aberrations in the illumination system. In the electron microscope 2000, the condenser lens system 14 and the upper polepiece of the objective lens 16 together constitute the illumination system.

The aberration corrector 30 is configured, for example, having multipole elements (such as hexapole elements and octopole elements) producing magnetic fields. The corrector 30 can correct higher-order aberrations such as spherical aberration and star aberration in the illumination system by producing a given magnetic field using multipole elements. For example, the corrector 30 corrects spherical aberration in the illumination system by producing negative spherical aberration so as to cancel out positive spherical aberration in the illumination system. The aberration corrector 30 corrects aberrations based on information about aberrations measured by the aberration measuring device 40.

The electron microscope 2000 is configured including an electron beam scanner 2010 and an image generator 2020. The electron beam scanner 2010 is disposed behind the condenser lens system 14. The scanner 2010 deflects the electron beam EB and scans the electron beam, or an electron probe, focused by both condenser lens system 14 and upper polepiece of the objective lens 16 over the sample S. The scanner 2010 has scan coils for deflecting the beam EB. The scanner 2010 scans the electron beam (electron probe), based on a scan signal generated by a scan signal generator (not shown).

The image generator 2020 operates to image a detection signal, which is produced from the imager 24 and indicates the intensity of the electron beam, in synchronism with the scan signal. As a result, a scanning transmission electron microscope (STEM) image is created. A scanning transmission electron microscope (STEM) image referred to herein is an image which is obtained by synchronizing the detection signal and the scan signal and which indicates a distribution of amounts of signal (intensities of the electron beam) corresponding to positions on the sample. The image generator 2020 outputs information about the created image (STEM image) to the aberration measuring device 40.

The aberration measuring device 40 measures aberrations in the illumination system by a probe tableau method. The probe tableau method is a technique consisting of taking plural STEM images while varying the angle of illumination of an electron beam on the sample S, deconvolving the STEM images to produce probe images, and measuring aberrations based on the probe images.

In the probe tableau method, a probe image is obtained by deconvolving an STEM image derived without tilting the electron beam and an STEM image derived while varying the angle of illumination of the electron beam, i.e., while tilting the electron beam. Higher-order aberrations such as spherical aberration and star aberration are measured by making use of apparent defocus and apparent two-fold astigmatism found from each probe image.

In particular, the aberration measuring device 40 first sets an angular range of the illumination of the electron beam EB when aberrations are measured by a probe tableau method. The aberration measuring device 40 sets the angular range of the illumination by obtaining information about the angular range found by the angular range computing device 100. The number of probe images used when aberrations are measured by the aberration measuring device 40 using a probe tableau method is preset to an arbitrary number.

The aberration measuring device 40 obtains information about the STEM images in accordance with the set angular range of the illumination and number of probe images. The aberration measuring device 40 controls the electron beam deflector 15 to obtain STEM images in the set angular range of the illumination and captures images by the imager 24 while varying the angle of illumination of the electron beam EB, thus deriving STEM images corresponding in number to the set number of probe images.

The aberration measuring device 40 deconvolves STEM images obtained while varying the angle of illumination of the electron beam EB (i.e., while tilting the beam) and an STEM image obtained without tilting the beam to thereby produce probe images and arranging the created probe images according to angle and orientation of illumination, thus creating a probe tableau. The probe tableau provides information about aberration coefficients $P_3$, $A_3$, $O_4$, $Q_4$, and $A_4$.

The aberration measuring device 40 outputs information about higher-order aberrations obtained by the probe tableau method to the aberration corrector 30. In response to the information about the aberrations, the aberration corrector 30 produces a given magnetic field, correcting aberrations in the illumination system. The aberration measuring device 40 outputs the information about the aberration coefficients obtained by a probe tableau method to the angular range computing device 100. The angular range computing device 100 calculates an angular range of the illumination of the electron beam EB on the basis of the information about the aberration coefficients.

The device 100 for computing an angular range for measurement of aberrations finds an angular range of the illumination of the electron beam EB when aberrations induced in the illumination system are measured by a probe tableau method. The computing device 100 is similar in configuration to the above-described computing device 100. Also, the portions 112, 114, and 116 of the processing section 110 of the computing device 100 are similar in operation to their respective counterparts of the above-described first embodiment and a description thereof is omitted.

In the angular range computing device 100 of the electron microscope 2000, the phase distribution computing portion 114 finds a distribution of phases in the electron beam passed through the illumination system on the basis of information about aberration coefficients of the illumination system, the information being obtained by the aberration coefficient information acquisition portion 112. The angular range computing portion 116 finds an angular range on the basis of information about the phase distribution. Therefore, the angular range computing device 100 can find an angular range of the illumination in which aberrations can be measured efficiently when aberrations induced in the illumination system are measured by a probe tableau method.

Since the electron microscope 2000 includes the device 100 for computing an angular range for measurement of aberrations, when aberrations induced in the illumination system are measured by a probe tableau method, STEM images for obtaining probe images can be captured in a shorter time. The aberrations in the illumination system can be measured efficiently.

2.2. Method of Aberration Correction

An aberration correction method implemented in an electron microscope having the angular range computing device associated with the second embodiment is next described.

The aberration correction method implemented in the electron microscope 2000 is similar to the aberration correction method implemented in the electron microscope 1000 as illustrated in FIG. 4 except for the following differences and so a description thereof is omitted.

In the aberration correction method practiced in the electron microscope 1000 illustrated in FIG. 4, the aberration measuring device 40 Fourier transforms TEM images obtained at various angles of illumination to create a diffractogram tableau (step S12). In contrast, in the aberration correction method performed in the electron microscope 2000, the aberration measuring device 40 deconvolves STEM images taken at various angles of illumination to create a probe tableau.

The aberration measurement angular range computing device 100 in the electron microscope 2000 is similar in operation to the aberration measurement angular range computing device 100 in the electron microscope 1000. That is, the method for computing an angular range for measurement of aberrations already described in connection with the flowchart of FIG. 5 is also applicable to the electron microscope 2000.

It is to be noted that the present invention is not restricted to the above-described embodiments but rather can be practiced in various forms without departing from the gist of the present invention.

For example, in the above example of the electron microscope 1000 shown in FIG. 1, the aberration corrector 30 corrects aberrations in the imaging system on the basis of information about aberrations found by the aberration measuring device 40. In the electron microscope associated with the present invention, information about aberrations found by the aberration measuring device 40 may be displayed on a display device (not shown) made of an LCD or a CRT. A user who sees the displayed information about aberrations may manipulate the aberration corrector 30 to correct aberrations in the imaging system. The same concept can be applied to the above-described electron microscope 2000 shown in FIG. 6. The electron microscope associated with the present invention may display information about aberrations found by the aberration measuring device 40 on the display device (not shown). A user who sees the displayed information about aberrations may manipulate the aberration corrector 30 to correct aberrations in the illumination system.

In the above example of the electron microscope 1000 shown in FIG. 1, the aberration measuring device 40 and the device 100 for computing an angular range for measurement of aberrations are separate instruments. In the electron microscope associated with the present invention, the aberration measuring device 40 and the device 100 for computing an angular range for measurement of aberrations may be realized by a single personal computer. The same concept can be applied to the above example of the electron microscope 2000 shown in FIG. 6. In the electron microscope associated with the present invention, the aberration measuring device 40 and the device 100 for computing an angular range for measurement of aberrations may be realized by a single personal computer.

In the above examples of electron microscope 1000 shown in FIG. 1 and electron microscope 2000 shown in FIG. 6, the device 100 for computing an angular range for measurement of aberrations obtains information about aberration coefficients delivered from the aberration measuring device 40 and finds an angular range of the illumination. The aberration measurement angular range computing device associated with the present invention may obtain information about aberration coefficients, for example, via the data storage medium 126 and find an angular range of the illumination. Furthermore, the aberration measurement angular range computing device associated with the present invention may obtain information about aberration coefficients entered, for example, via the manual control portion 120 to thereby obtain information about aberration coefficients and may find an angular range of the illumination.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An optical system comprising:
an electron beam source that produces an electron beam;
an electron beam deflector for varying an angle of illumination of the electron beam produced by the electron beam source through an angular range of illumination;
a computer device for computing the angular range of illumination of the electron beam when aberrations in the optical system are measured by a tableau method, said computer device comprising:
an aberration coefficient information acquisition portion for obtaining information about aberration coefficients of the optical system having means for generating a tableau of diffractograms while varying the angle of illumination of the electron beam;
a phase distribution computing portion for finding a distribution of phases in the electron beam passed through the optical system on the basis of the information about the aberration coefficients; and
an angular range computing portion for finding the angular range of illumination on the basis of the distribution of phases found by the phase distribution computing portion,
wherein said phase distribution computing portion finds said distribution of phases, using the following equation:

$$X(\omega) = \frac{2\pi}{\lambda} \text{Re}\left[\frac{1}{3}P_3\bar{\omega}^2\omega + \frac{1}{3}A_3\bar{\omega}^3 + \frac{1}{4}O_4\bar{\omega}^2\omega^2 + \frac{1}{4}Q_4\bar{\omega}^3\omega + \frac{1}{4}A_4\bar{\omega}^4 + \right]$$

where X is the distribution of phases, $\omega$ is a complex angle, $\bar{\omega}$ is the complex conjugate of $\omega$, $\lambda$ is the wavelength of the electron beam, and $P_3, A_3, O_4, Q_4,$ and $A_4$ are aberration coefficients, and wherein $P_3$ is comatic aberration, $A_3$ is three-fold astigmatism, $O_4$ is third-order spherical aberration, $Q_4$ is star aberration, $A_4$ is four-fold astigmatism, and Re indicates that the real part of the formula within the square brackets is taken; and an aberration measuring device to measure the aberrations in the optical system, wherein the aberration measuring device receives data associated with the angular range of illumination from the computer device; and wherein the aberration measuring device controls the angle of illumination of the electron beam with the electron beam deflector based on the data associated with the angular range of illumination received from the computer device; and wherein the aberration measuring device measures the aberrations based on the data associated with the angular range of illumination.

2. The optical system as set forth in claim 1, wherein said angular range computing portion sets the upper limit of said angular range of illumination to be equal to or greater than an angle of illumination at which phases in the distribution of phases found by said phase distribution computing portion have absolute values of $\pi/4$ or $\pi/2$.

3. The optical system as set forth in claim 1, wherein said optical system is an imaging system.

4. The optical system as set forth in claim 1, wherein said optical system is an illumination system.

5. An electron microscope including the optical system of claim 1.

6. The optical system as set forth in claim 1, further comprising:

an aberration corrector that corrects the aberrations in the optical system by producing a magnetic field based on information about the aberrations measured by the aberration measuring device.

7. The optical system as set forth in claim 6, wherein the aberration corrector corrects the aberrations in the optical system based on the aberration measuring device determining that aberration correction is necessary, and wherein the aberration measuring device determines that aberration correction is necessary based on the information about the aberrations.

8. A method for measuring aberrations in an optical system, the method comprising:

computing an angular range of illumination of an electron beam when aberrations in the optical system are measured by a tableau method, wherein computing the angular range of illumination of the electron beam comprises:

producing an electron beam;

generating a tableau of diffractograms while varying an angle of illumination of the electron beam with an electron beam deflector;

obtaining information about aberration coefficients of the optical system;

finding a distribution of phases in the electron beam passed through the optical system on the basis of the information about the aberration coefficients; and finding the angular range of illumination on the basis of the found distribution of phases, wherein during said step of finding a distribution of phases, the distribution of phases is found using the following equation:

$$X(\omega) = \frac{2\pi}{\lambda} \text{Re}\left[\frac{1}{3}P_3\overline{\omega}^2\omega + \frac{1}{3}A_3\overline{\omega}^3 + \frac{1}{4}O_4\overline{\omega}^2\omega^2 + \frac{1}{4}Q_4\overline{\omega}^3\omega + \frac{1}{4}A_4\overline{\omega}^4 + \right]$$

where X is the distribution of phases, $\omega$ is a complex angle, $\overline{\omega}$ is the complex conjugate of $\omega$, $\lambda$ is the wavelength of the electron beam, and $P_3, A_3, O_4, Q_4,$ and $A_4$ are aberration coefficients, and wherein $P_3$ is comatic aberration, $A_3$ is three-fold astigmatism, $O_4$ is third-order spherical aberration, $Q_4$ is star aberration, $A_4$ is four-fold astigmatism, and Re indicates that the real part of the formula within the square brackets is taken; and measuring the aberrations in the optical system based on the angular range of illumination; and controlling the angle of illumination of the electron beam with the electron beam deflector based on the angular range of illumination.

9. The method of claim 8, wherein during said step of finding the angular range, the upper limit of the angular range of illumination is set to be equal to or greater than an angle of illumination at which phases in the distribution of phases found by the step of finding a distribution of phases have absolute values of $\pi/4$ or $\pi/2$.

10. The method of claim 8, wherein said optical system is an imaging system.

11. The method of claim 8, wherein said optical system is an illumination system.

12. The method as set forth in of claim 8, further comprising:

determining that aberration correction is necessary based on information about the aberrations in the optical system obtained by measuring the aberrations in the optical system;

correcting the aberrations in the optical system based on determining that aberration correction is necessary.

* * * * *

UNITED STATES PATENT AND TRADEMARK OFFICE
CERTIFICATE OF CORRECTION

PATENT NO. : 10,332,719 B2
APPLICATION NO. : 14/743086
DATED : June 25, 2019
INVENTOR(S) : Shigeyuki Morishita Page 1 of 1

It is certified that error appears in the above-identified patent and that said Letters Patent is hereby corrected as shown below:

In the Claims

Column 18, Line 59, Claim 1, delete "$\frac{1}{4}A_4\overline{\omega}^4 +]$" and insert -- $\frac{1}{4}A_4\overline{\omega}^4]$ --

Column 20, Line 14, Claim 8, delete "$\frac{1}{4}A_4\overline{\omega}^4 +]$" and insert -- $\frac{1}{4}A_4\overline{\omega}^4]$ --

Column 20, Line 42, Claim 12, after "in" delete "of"

Signed and Sealed this
Third Day of September, 2019

Andrei Iancu
*Director of the United States Patent and Trademark Office*